(12) United States Patent
Cheung et al.

(10) Patent No.: US 7,952,963 B2
(45) Date of Patent: May 31, 2011

(54) SYSTEMS AND METHODS FOR TELESCOPIC DATA COMPRESSION IN SENSOR NETWORKS

(75) Inventors: Patrick Y. H. Cheung, New York, NY (US); Nicholas F. Maxemchuck, Mountainside, NJ (US)

(73) Assignee: The Trustees of Columbia University in the City of New York, New York, NY (US)

( * ) Notice: Subject to any disclaimer, the term of this patent is extended or adjusted under 35 U.S.C. 154(b) by 0 days.

(21) Appl. No.: 12/615,874

(22) Filed: Nov. 10, 2009

(65) Prior Publication Data

US 2010/0091834 A1 Apr. 15, 2010

Related U.S. Application Data

(63) Continuation of application No. PCT/US2008/063302, filed on May 9, 2008.

(60) Provisional application No. 60/941,201, filed on May 31, 2007, provisional application No. 60/917,466, filed on May 11, 2007.

(51) Int. Cl.
*H04B 1/06* (2006.01)
(52) U.S. Cl. ....................................................... 367/136
(58) Field of Classification Search ................... 367/136
See application file for complete search history.

(56) References Cited

U.S. PATENT DOCUMENTS

| 2006/0045366 | A1 | 3/2006 | Chefd'hotel |
| 2006/0187866 | A1 | 8/2006 | Werb et al. |
| 2006/0227664 | A1 | 10/2006 | Horak |
| 2006/0253570 | A1 | 11/2006 | Biswas et al. |
| 2010/0091834 | A1* | 4/2010 | Cheung et al. ............... 375/240 |

FOREIGN PATENT DOCUMENTS

WO WO 2008141225 A1 * 11/2008

OTHER PUBLICATIONS

Cheung et al.; Telescopic Data Compression in Dense Sensor Networks that Support Fire-Fighters; Nov. 2007; Global Telecommunications Conference, 2007. GLOBECOM '07, IEEE; pp. 914-919.*
Cheung, et al., "Alpha Tree in Sensor Network", 3rd New York Metro Area Networking Workshop (http://www.nyman-workshop.org/2003/program.html), Sep. 12, 2003, pp. 1-3.
Hexmoor, et al., Probability Based Optimal Algorithm for Multi-sensor Multi-target Dection, Integration of Knowledge Intensive Multi-Agent Systems, 2007. KIMAS 2007, International Conference, May 3, 2007, pp. 289-293, ISBN: 1-4244-0945-4.

* cited by examiner

*Primary Examiner* — Dan Pihulic
(74) *Attorney, Agent, or Firm* — Baker Botts L.L.P.

(57) ABSTRACT

Systems and methods for telescopic data compression in sensor networks are disclosed herein. An exemplary method of the disclosed subject matter for telescopically compressing data received from a plurality of sensors in a network adapted to detect a field includes broadcasting a first set of sampling positions to sensors, forming a first set of clusters of sensors based on the sampling positions, receiving data from the sensors contained within the clusters, performing local interpolation of the received data, reconstructing a representation of the field using the interpolated data, and determining areas of interest based on the reconstructed representation of the field.

22 Claims, 13 Drawing Sheets

FIG.1

∘ Sensor

▲ Regular sampling position $\vec{x}_v$

◯ Cluster of sensors

FIG.2

◯ Interpolation cluster

▲ Regular sampling position $\vec{x}_v$

○ Clusterhead

• Sensor

SYSTEMS AND METHODS FOR TELESCOPIC DATA COMPRESSION IN SENSOR NETWORKS

CROSS REFERENCE TO RELATED APPLICATIONS

This application is a continuation of International Application No. PCT/US2008/063302 entitled "Systems And Methods For Telescopic Data Compression In Sensor Networks", filed May 9, 2008, which claims priority to U.S. Provisional Application No. 60/917,466 entitled "Telescopic Data Compression for Dense Sensor Networks", filed on May 11, 2007 and U.S. Provisional Application No. 60/941,201 entitled "Telescopic Data Compression for Dense Sensor Networks", filed on May 31, 2007, which are incorporated by reference in their entirety herein.

STATEMENT REGARDING FEDERALLY-SPONSORED RESEARCH

This invention was made with government support under CNS-0435168 awarded by the National Science Foundation. The government has certain rights in the invention.

BACKGROUND

1. Field

The present application relates to systems and methods for telescopic data compression in sensor networks.

2. Background Art

The primary goal of sensor networks is to collect data of a physical phenomenon over a region. Sensor networks come in a wide variety, covering different geographical areas, using devices with different energy constraints, and implementing an assortment of applications. Some such networks have a large number of energy constrained sensors randomly distributed over a large area. The sensors forward data to nearby sensors until it reaches a sink, which is a collection point connected to the data processing center through a wired network. Such a network may be useful for measuring many different kinds of physical phenomena.

The field of most physical phenomena can be described by a smooth continuous signal. Even though spikes may occasionally occur, they are mostly confined to sporadic patches in a greater region of a smooth profile. This can be readily illustrated by simple examples, like the temperature distribution over a heated surface, the intensity of seismic vibrations decreasing gradually away from the epicenter, and in the case of a chemical leakage, the chemical concentration thinning out as the distance from the leak increases.

Many sensor network applications are characterized by an uneven distribution of information content, with useful information concentrated in isolated target regions. In such cases, data collection can be improved if target regions can be identified by sampling sparsely at a low energy cost, and then raising the sampling density progressively only in those regions of interests until the desired resolution is reached. There are several major technical challenges that inhibit the direct application of existing sampling-theoretic techniques to the compression of data in sensor networks, including: (i) random placement of sensors, (ii) noise in sensor measurements, (iii) limitations in the computational capacity of individual sensors, making complicated non-uniform sampling techniques unpractical, and (iv) the need that compression be done in a distributed manner. Thus there is a need for technique which overcomes these challenges.

SUMMARY

Systems and methods for telescopic data compression in sensor networks are disclosed herein.

An exemplary method of the disclosed subject matter for telescopically compressing data received from a plurality of sensors in a network adapted to detect a field includes broadcasting a first set of sampling positions to sensors, forming a first set of clusters of sensors based on the sampling positions, receiving data from the sensors contained within the clusters, performing local interpolation of the received data, reconstructing a representation of the field using the interpolated data, and determining areas of interest based on the reconstructed representation of the field.

In some embodiments, a method for telescopically compressing data received from a plurality of sensors in a network adapted to detect a field further includes broadcasting a second set of new sampling positions to sensors within the areas of interest, forming a second set of clusters based on the second set of new sampling positions, and utilizing the second set of clusters to re-receive data from the sensors, repeat local interpolation of the re-received data, repeat reconstruction of the representation of the field using the interpolated data, and re-determine the areas of interest.

In some embodiments, forming clusters of sensors includes designating sensors as cluster heads. In some embodiments, forming clusters of sensors includes selecting sensors within a fixed range from the sampling positions. Forming clusters of sensors can further include limiting the number of sensors selected by use of a probability algorithm, or selecting a predetermined number of sensors that are closest to the sampling positions, or both.

In some embodiments, performing local interpolation includes forwarding data of the sensors contained within the clusters to cluster heads, and using the cluster heads to estimate the value of the field at the sampling positions. The cluster heads can be used to apply a digital low-pass filter algorithm to the data.

In some embodiments, estimating the value of the representation of the field and applying the digital low-pass filter algorithm are performed utilizing the same scattered data interpolation algorithm. In some embodiments, the scattered data interpolation algorithm is a Gaussian-weighted averaging algorithm. In some embodiments, the local interpolation is performed simultaneously for all of the clusters. In some embodiments, reconstructing the representation of the field includes transmitting the local interpolated data to sensors closest to a wireless access point, transmitting the local interpolated data from that wireless access point to a processing center, and processing the local interpolated data to reconstruct the representation of the field. In some embodiments, transmitting the local interpolated data to sensors closest to a wireless access point is performed utilizing a shortest path algorithm.

An exemplary system of the disclosed subject matter for telescopically compressing data received from a plurality of sensors in a network adapted to detect a field includes a processor, a wireless connection device operatively coupled to the processor, sensors operatively connected to the wireless connection device, and a memory operatively coupled to the processor. The memory stores program instructions that when executed by the processor, cause the processor to utilize the wireless connection device to broadcast a first set of sampling positions to the sensors, form a first set of clusters of sensors based on the sampling positions, receive data from the sensors contained within the clusters, perform local interpolation of the received data, reconstruct a representation of the field using the interpolated data, and determine areas of interest based on the reconstructed representation of the field.

In some embodiments, the execution by the processor of the memory storing program instructions causes the processor to utilize the wireless connection device to further broadcast a second set of new sampling positions to sensors within the areas of interest, form a second set of clusters based on the second set of new sampling positions, re-receive data from the sensors, and utilize the second set of clusters to re-receive data from the sensors, repeat local interpolation of the re-received data, repeat reconstruction of the representation of the field using the interpolated data, and re-determine the areas of interest.

BRIEF DESCRIPTION OF THE DRAWINGS

The accompanying drawings, which are incorporated and constitute part of this disclosure, illustrate some embodiments of the disclosed subject matter.

DETAILED DESCRIPTION

The emergence of dense sensor networks in recent years has created a brand new paradigm for distributed sensing. Small-size, low-cost sensors of poor precision are distributed randomly in bulk to carry out a sensing task. Though individual sensor readings are inaccurate, aggregating multiple readings in a neighborhood can improve the accuracy. The disclosed subject matter utilizes this advantage of regional cooperative processing to generate virtual samples, which are sent to the destination for global signal reconstruction. An application can then gradually zoom in on certain target regions by instructing the network to raise the sampling resolution in those regions in successive rounds of data collection.

An exemplary data compression framework includes two levels of operation. The first level is to obtain a set of virtual samples $\{f(\vec{x}_v)\}$ at regular sampling positions $\{\vec{x}_v\}$. Each virtual sample $f(\vec{x}_v)$ is computed by locally interpolating the cluster of sensor measurements around $\vec{x}_v$. Within each cluster, one sensor is chosen as the cluster head which collects sensor readings and performs interpolation. In this way, the many sensor readings in a cluster are compressed to one sample value. At the second level, the processing center collects the virtual samples $\{f(\vec{x}_v)\}$ from all the cluster heads and then reconstructs a representation of the physical field by applying a smoothing filter on the samples. The accuracy of the reconstructed signal largely depends on the regular sampling density and the cluster size.

Figure 1:
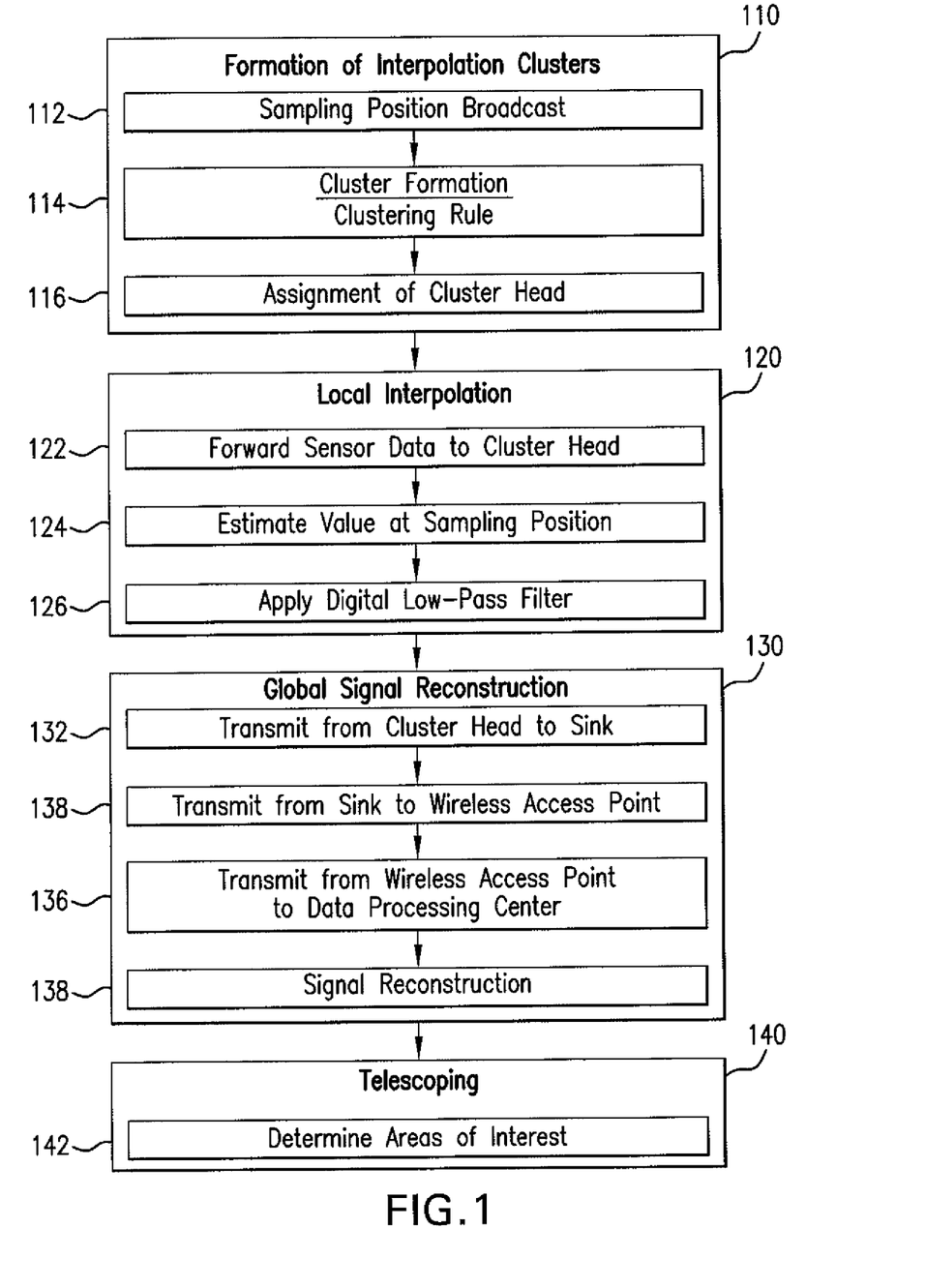
FIG. 1 illustrates a chart of a method in accordance with an embodiment of the disclosed subject matter.

FIG. 1 illustrates an exemplary method 100 according to the disclosed subject matter. To initiate the formation of interpolation clusters 110, the set of sampling positions $\{\vec{x}_v\}$ are broadcast 112 to the sensors by a base station. The density of the sampling positions can determine the signal bandwidth to be captured by the network: e.g., a higher density can mean a wider detection bandwidth and a smaller overall compression ratio. Sensors can then be formed 114 into clusters around each of the sampling positions $\vec{x}_v$ based on clustering rules, for example, by grouping all sensors within a range R from $\vec{x}_v$. One sensor from each cluster can then be selected 116 as the cluster head.

A good clustering rule should result in clusters having the right size, striking a balance between interpolation accuracy and computational efforts. A large cluster size is on one hand good for accuracy, but on the other hand stressful for computation. In addition, clusters should be formed with data points spread as evenly as possible for a better interpolation quality.

A simple rule that all sensors within a fixed range R from the position of a virtual sample $\vec{x}_v$ are grouped into the same cluster can also be used, where R is a measure of distance. Alternatively, a rule that chooses the N sensors closest to the position of a virtual sample $\vec{x}_v$ can be used, where N is a whole number. Utilizing a fixed range method, a sensor can decide its cluster affiliation by checking only its own distance to $\vec{x}_v$ without knowing the locations of others. The value of R can be chosen such that only data points significantly correlated to the value at $\vec{x}_v$ are included. For interpolation based on low-pass filtering, R can be made dependent on the filter bandwidth.

Figure 2:
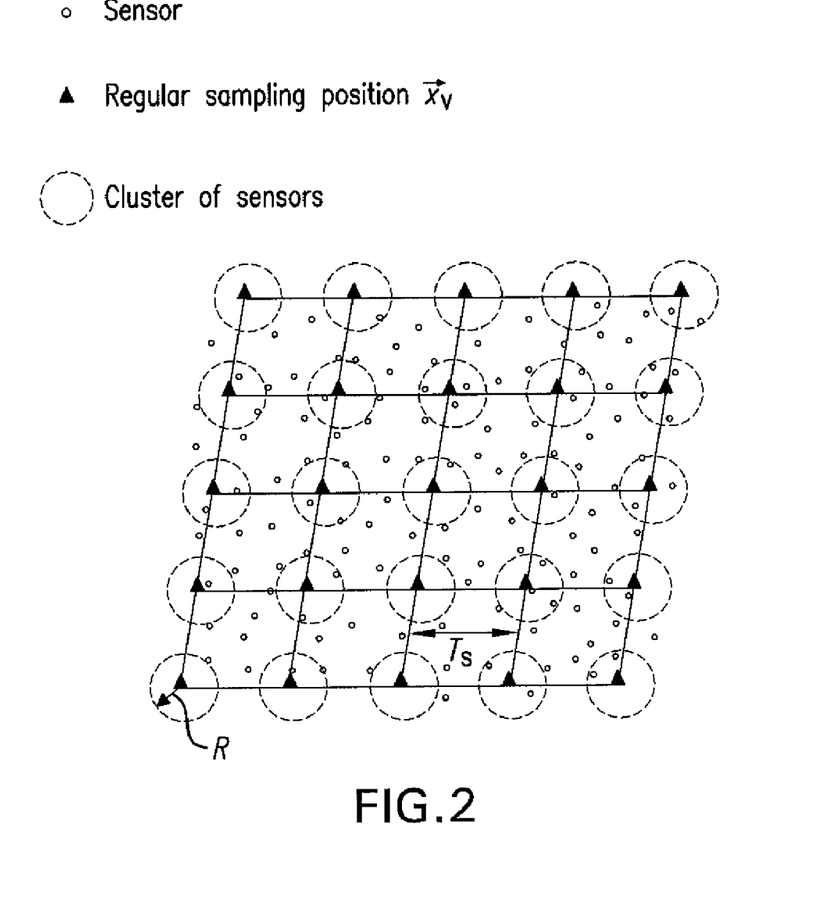
FIG. 2 is a diagram of a sensor network in accordance with an embodiment of the disclosed subject matter.

FIG. 2 shows an exemplary layout of sensors at random positions in relation to sampling positions $\vec{x}_v$. FIG. 2 further shows the distance between sampling positions is $T_s$ and the R is the radius of each cluster. FIG. 2 illustrates an exemplary embodiment where sampling positions $\vec{x}_v$ are regularly spaced.

In an exemplary embodiment, $T_s$ is equal to 7.2 meters and R is equal to 3.6 meters. In an exemplary embodiment utilizing a Gaussian algorithm, σ (the standard deviation) can equal at least $0.38T_s$ to avoid aliasing, as described in detail below. By choosing $R=0.5T_s$ (in other words half the distance between sampling positions $\vec{x}_v$), which is the maximum range for non-overlapping clusters, data of weightings smaller than 0.42 are excluded. If that value of R results in too large a cluster size, measured by $$N=\pi R^2 \rho_{sensor} \quad (1)$$

for a circular cluster, where $\rho_{sensor}$ is the sensor density, random suppression of sensors can be enforced by applying a probability algorithm, e.g., a turn-off probability algorithm such as $$P_b(\text{Suppression})=1-N_{interp}/\pi R^2 \rho_{sensor} \quad (2)$$

where $N_{interp}$ is the desired number of sensors involved in the interpolation.

Returning to FIG. 1, local interpolation 120 can be performed by sensors in a cluster forwarding 122 their measurements to the cluster head, which can estimate 124 the virtual sample $f(\vec{x}_v)$, i.e., the estimated value of the field at the center $\vec{x}_v$ of the cluster, using a scattered data interpolation algorithm.

A digital low-pass filter algorithm can be applied 126 to reduce the white noise from the sensor readings and further to prevent aliasing during global signal reconstruction. In one embodiment, sensors can utilize a shortest path algorithm, e.g., Dijkstra's Algorithm, to determine the route to forward 122 data to the cluster head. Sensors which are not located in any cluster can be rendered non-transmitting.

Figure 3:
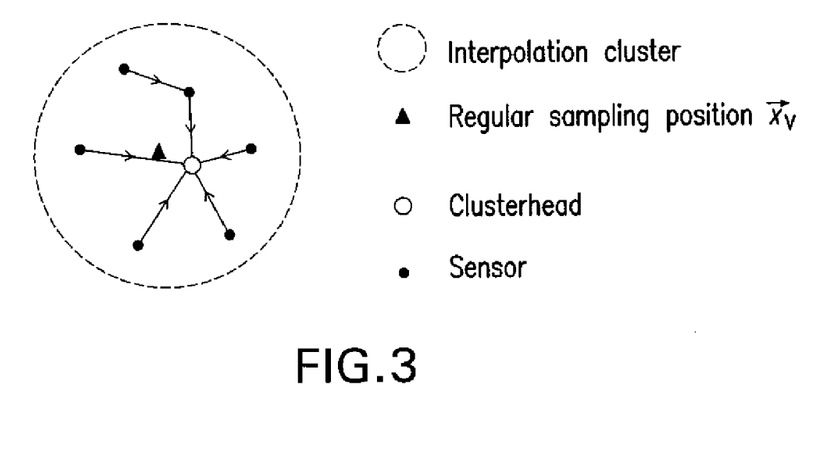
FIG. 3 is a diagram of an interpolation cluster in accordance with an embodiment of the disclosed subject matter.

FIG. 3 illustrates an exemplary interpolation cluster with a sampling position $\vec{x}_v$ located at the center of the cluster. FIG. 3 further illustrates the sensors making use of a shortest path algorithm to forward their respective data to the cluster head.

A wide variety of scattered data interpolation algorithms are suitable for use in the estimation 124 of virtual samples $f(\vec{x}_v)$. The choice of interpolation model depends largely on factors, like the type of data, the required accuracy, the distribution of data points, the quality of measurements, and the affordable amount of computation. An example of a simple algorithm is the nearest neighbor method, which estimates a point simply by its closest sample. Distance-weighting methods, based on the principle of assigning more weights to sample points closer to the target, can also be utilized and can be fairly simple and yet yield reasonably good results in most cases. Examples of weighting functions include averaging, inverse distance ($w=d^{-k}$) and Gaussian ($w=e^{-d^2/2\sigma^2}$) weightings.

In an exemplary embodiment, the estimate 124 of the virtual sample $f(\vec{x}_v)$ and the application 126 of a digital low-pass filter may be performed utilizing the same scattered data interpolation algorithm. In the same or another embodiment, a Gaussian-weighted averaging algorithm can be utilized, with weighting function $$w=e^{-d^2/2\sigma^2} \quad (3)$$

where d is the distance between a sensor and the point being interpolated and σ is the standard deviation. The spatial variance of this digital low-pass filter can be related to its 3 dB (decibel) bandwidth by the expression $\sigma^2=\ln 2/(2\pi^2 B_{3dB}^2)$ or $\sigma=0.19/B_{3dB}$. As referenced above, where the regular interval of the sampling positions $\vec{x}_v$ is $T_s$, the filter bandwidth can then be set to be smaller than $\frac{1}{2}T_s$, and resulting in a σ value of $0.38T_s$. In the same or another embodiment, every cluster may perform the estimate 124 and the application 126 of a digital low-pass filter utilizing the same scattered data interpolation algorithm simultaneously.

Referring again to FIG. 1, global signal reconstruction 130 can be performed by each cluster head transmitting 132 its estimated virtual sample $f(\vec{x}_v)$ to the closest sink, which transmits 134 the virtual sample data to a wireless access point, which in turn transmits 136 the data to a processing center where a signal reconstruction algorithm can be utilized 138 to reconstruct the signal (i.e., the physical field). In one embodiment, the virtual sample data can be routed directly to the sink utilizing a shortest path tree, i.e., the path determined utilizing a shortest path algorithm, e.g., Dijkstra's Algorithm.

In an exemplary embodiment, the field reconstruction is done at the processing center by applying a low-pass filter. In one exemplary embodiment, the processing center can apply a box-like low-pass filter, denoted by the equation $$H(u,v)=T_s^2 \text{rect}(uT_s)\text{rect}(vT_s) \quad (4)$$

where u and v are the dimensions in the frequency domain, $T_s$ is the distance between sampling intervals, and rect( ) is the rectangular function. The corresponding filter function in the spatial domain can be described by the equation $$h(x,y)=\text{sinc}(x/T_s)\text{sinc}(y/T_s) \quad (5)$$

where x and y are coordinates of the sampling positions and sinc( ) is the sinc function. The original signal, i.e., the representation of the detected field, can be reconstructed using the equation $$\hat{f}(x, y) = \sum_i (z_i \text{sinc}((x - x_i)/T_s)\text{sinc}((y - y_i)/T_s)) \quad (6)$$

where $s_i=(x_i, y_i, z_i)$ are sample points: $x_i$ and $y_i$ are the coordinates of the sampling position and $z_i$ is the value of the field at position $(x_i, y_i)$.

Figure 4:
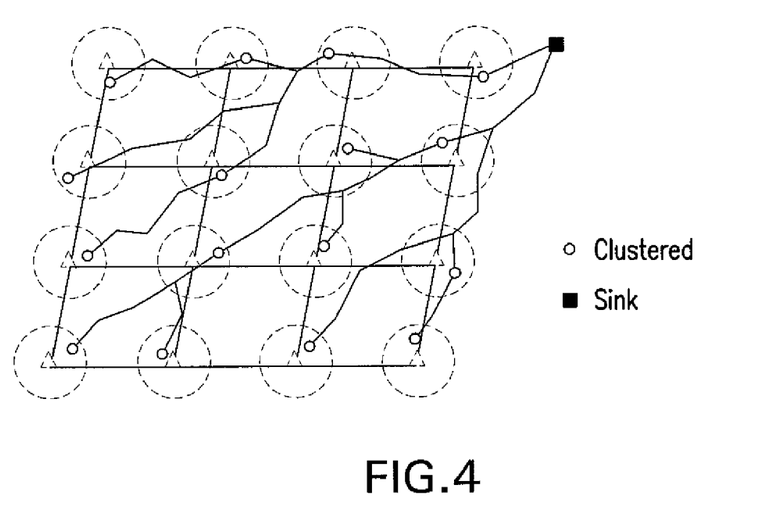
FIG. 4 is a diagram of a shortest path tree for a sensor network in accordance with an embodiment of the disclosed subject matter.

FIG. 4 illustrates an exemplary shortest path tree for the sensor network depicted in FIG. 2. As illustrated in FIG. 4, the various cluster heads can forward their data packet(s) along the shortest path to a sink point. In one embodiment, the sink can be the nearest sensor to a wireless access point.

Figure 5:
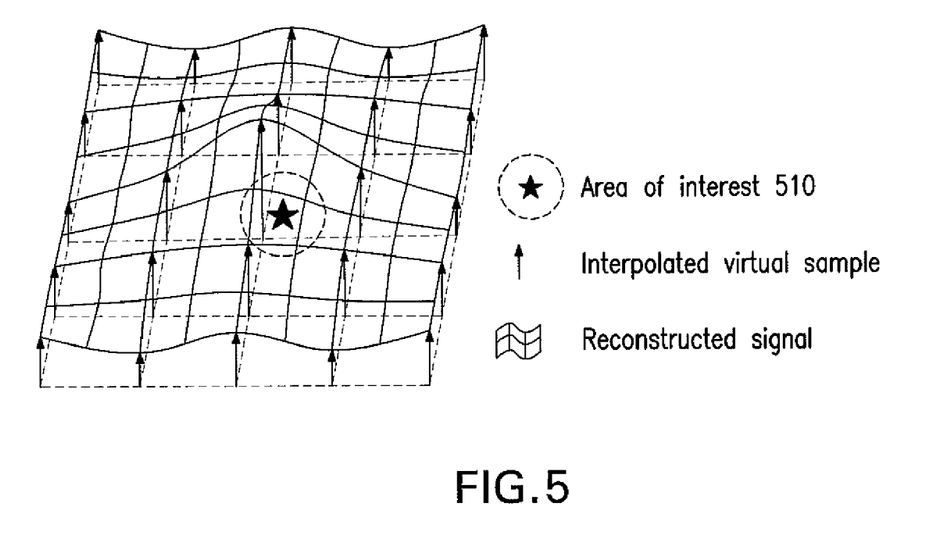
FIG. 5 is a diagram of a representation of a field after application of a global signal reconstruction in accordance with an embodiment of the disclosed subject matter.

FIG. 5 illustrates a perspective graph according to an exemplary global signal reconstruction of the sensor network depicted in FIG. 2. FIG. 5 further illustrates an area of interest 510 enclosing the highest virtual sample value. An area of interest 510 may be selected according to various criteria, including areas with virtual sample values above and/or below a certain threshold value.

Referring again to FIG. 1, in an exemplary embodiment, telescoping 140 can be performed by determining 142 an area of interest (such as area 510 in FIG. 5), then re-broadcasting 112 a new set of sampling positions $\{\vec{x}_u\}$. In one embodiment, the new sampling positions $\vec{x}_u$ can be more closely spaced in and around areas of interest (such as area 510 in FIG. 5). The telescoping 140 can be further performed by re-forming 114 clusters around each of the new sampling positions $\vec{x}_u$ based on the same or different clustering rules, as detailed above. The telescoping 140 can be further performed by repeating the local interpolation 120 and the global signal reconstruction 130, one or more times. The telescoping 140 process, including the repetition of position broadcasting, cluster forming, local interpolation, and global signal reconstruction, can be repeated until a desired resolution of the physical field is obtained.

Figure 6:
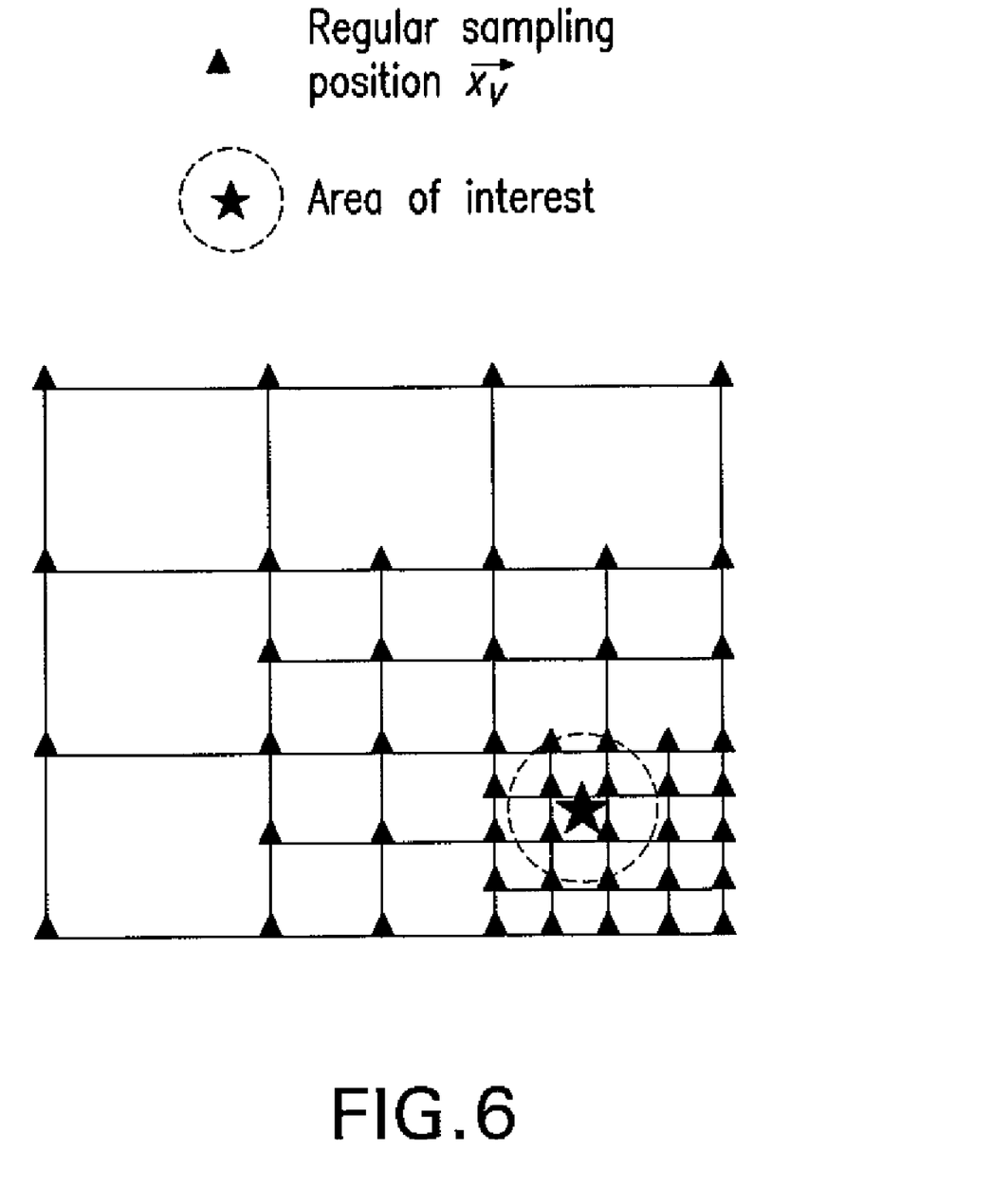
FIG. 6 is a diagram of a sampling position gird after telescoping in accordance with an embodiment of the disclosed subject matter.

In an exemplary embodiment, the initial uniform sampling density is high enough to extract the frequency spectrum of the target physical field. After the first round of data collection, an overall signal profile can be reconstructed (e.g., as illustrated in FIG. 5), so that an application can identify areas of interest and increase the uniform sampling density in those regions. FIG. 6 illustrates an example of increasing sampling density around an area of interest 510, such as that depicted in FIG. 5, according to the telescoping method.

Figure 7A:
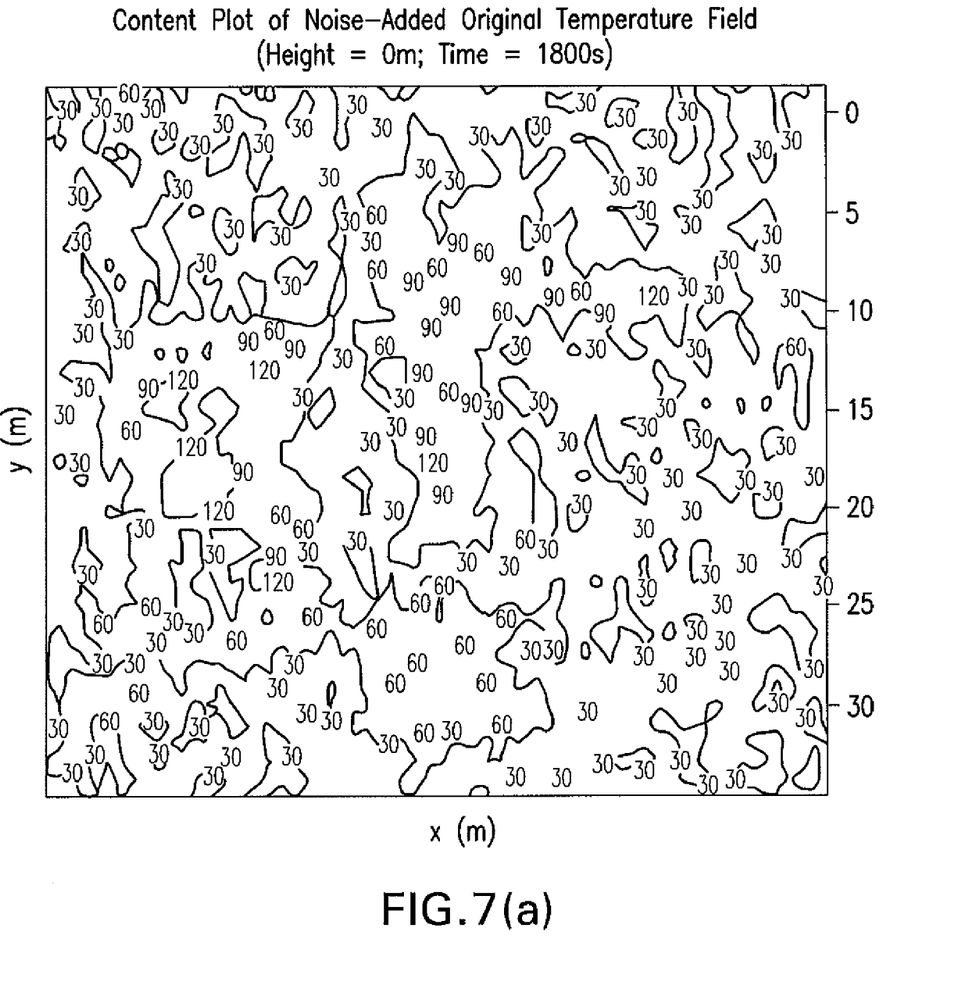
FIGS. 7(a)-(b) are a contour plot and a corresponding three dimensional graph, respectively, of the temperature distribution for a fire detection application in accordance with an embodiment of the disclosed subject matter.
Figure 7B:
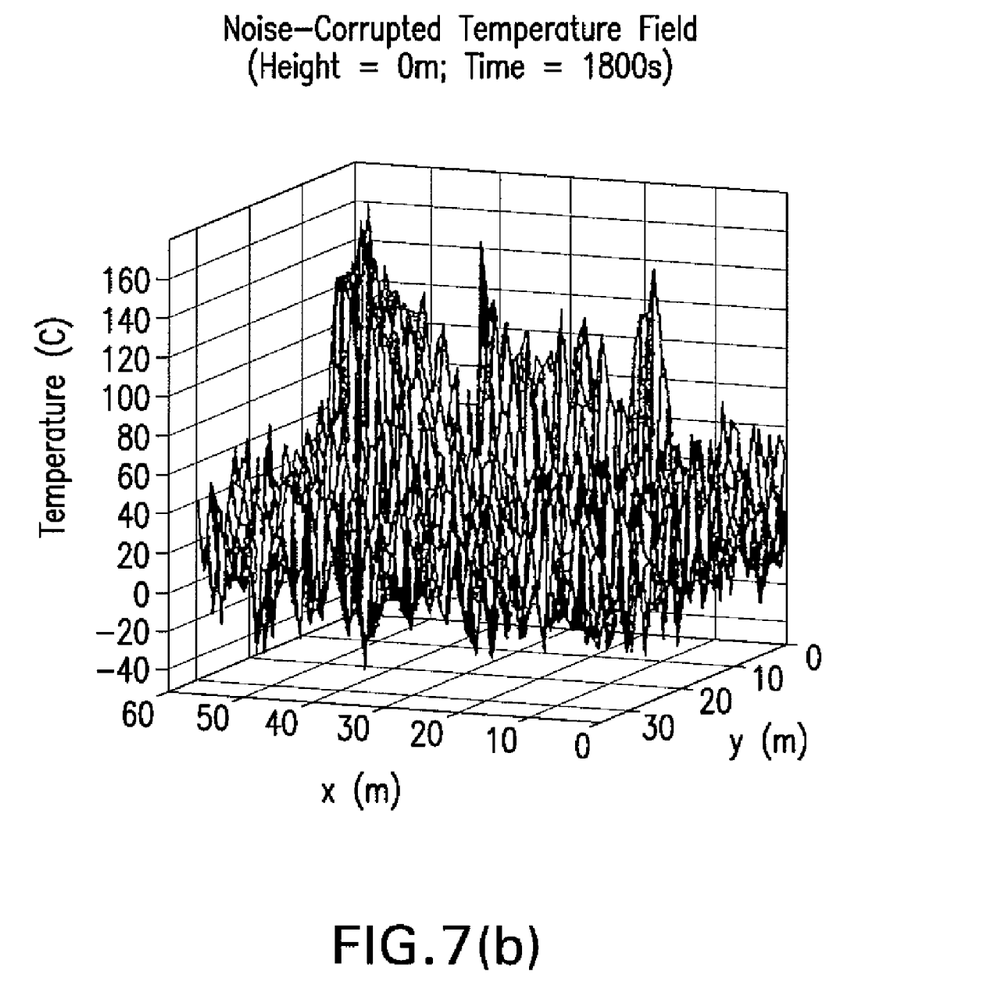

FIGS. 7(a) through 10(b) illustrate the use of an exemplary method in accordance with the disclosed subject matter for a fire detection application. In the sensing of a fire, a sensor network can first obtain a rough temperature distribution. FIG. 7(a) illustrates a contour plot of that rough temperature distribution. FIG. 7(b) illustrates the corresponding three dimensional graph of the same temperature distribution, emphasizing the relatively high signal to noise ratio (SNR), e.g., 6 dB for this example.

Figure 8A:
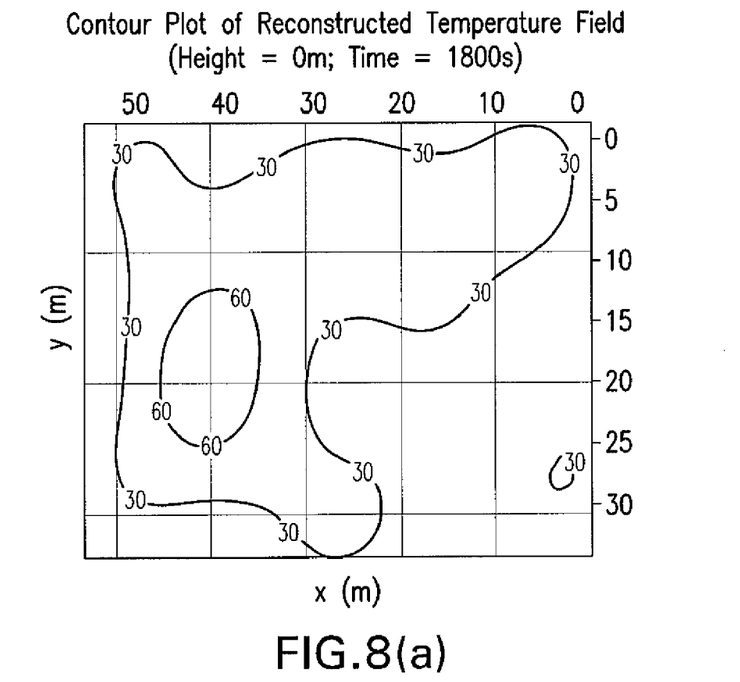
FIGS. 8(a)-(b) are a contour plot and a corresponding three dimensional graph, respectively, of the temperature distribution for a fire detection application after one iteration in accordance with an embodiment of the disclosed subject matter.
Figure 8B:
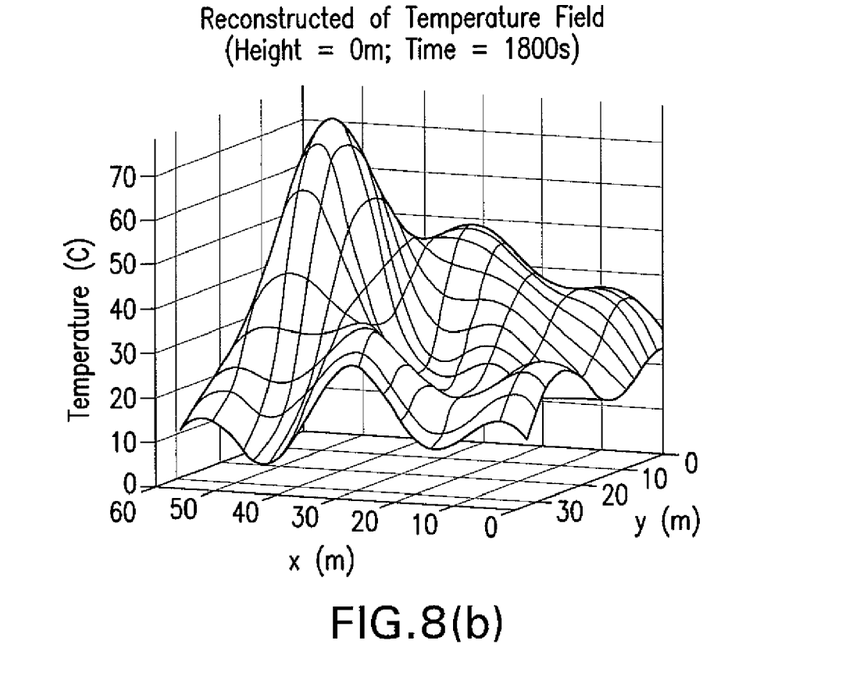

FIGS. 8(a) and 8(b) illustrate the reconstructed physical field after one iteration of an exemplary method in accordance with the disclosed subject matter. The application can then request a higher uniform sampling density in the potential areas of interest, so as to obtain finer details for the estimation of fire size and its spread rate. The refinement process is repeated for several rounds until the desired level of details is reached.

Figure 9A:
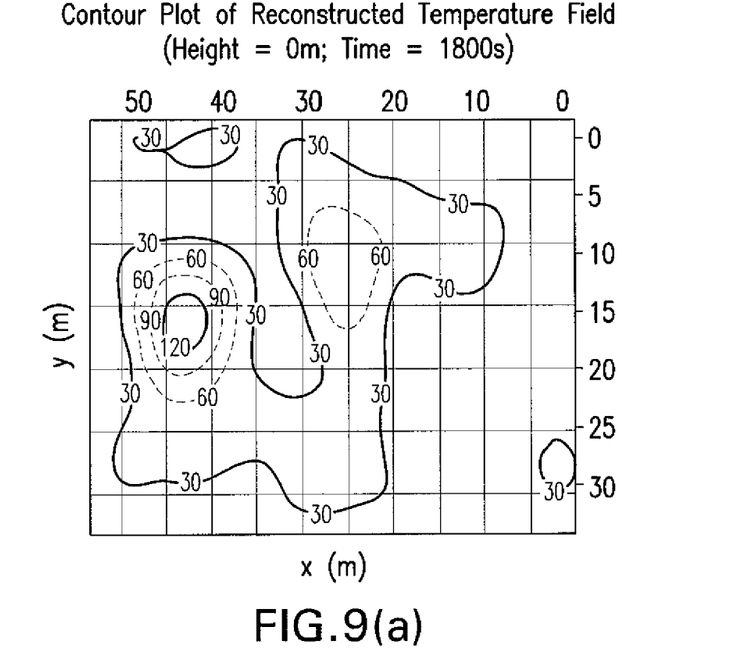
FIGS. 9(a)-(b) are a contour plot and a corresponding three dimensional graph, respectively, of the temperature distribution for a fire detection application after two iterations in accordance with an embodiment of the disclosed subject matter.
Figure 9B:
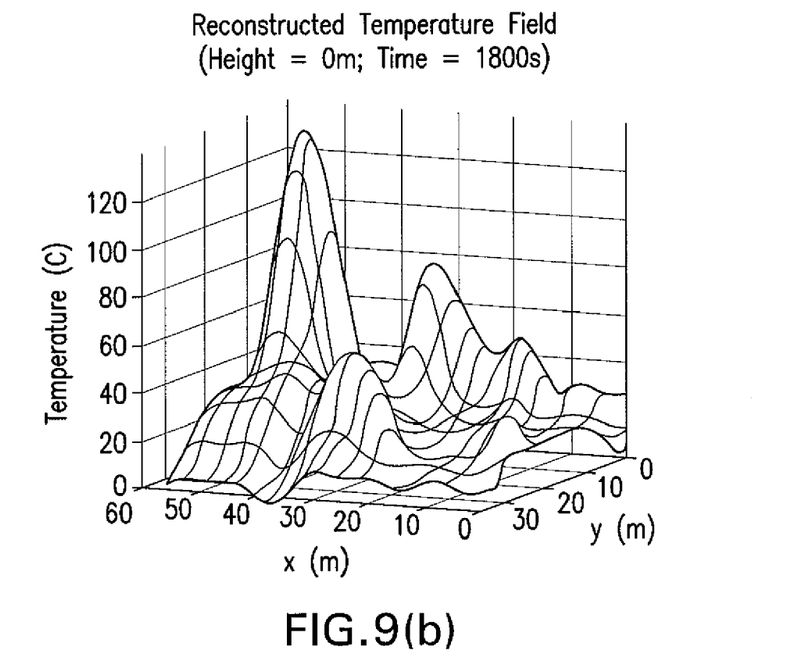
Figure 10A:
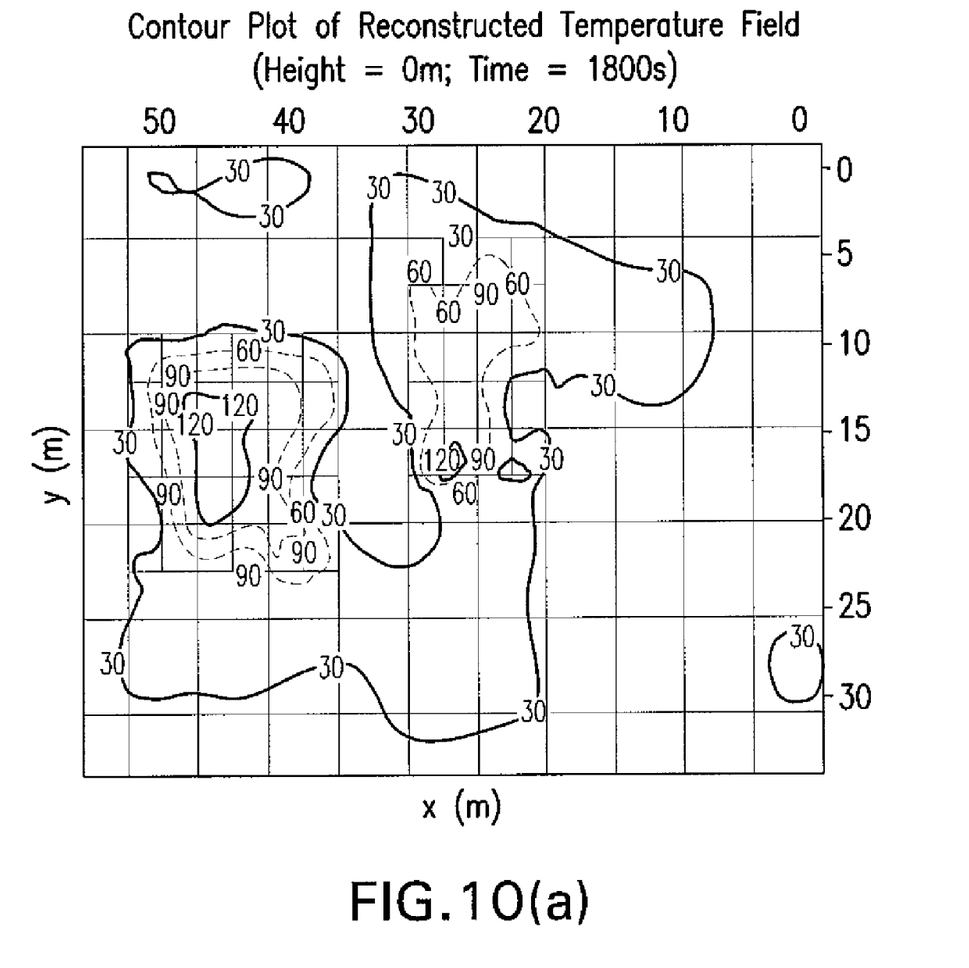
FIGS. 10(a)-(b) are a contour plot and a corresponding three dimensional graph, respectively, of the temperature distribution for a fire detection application after three iterations in accordance with an embodiment of the disclosed subject matter.
Figure 10B:
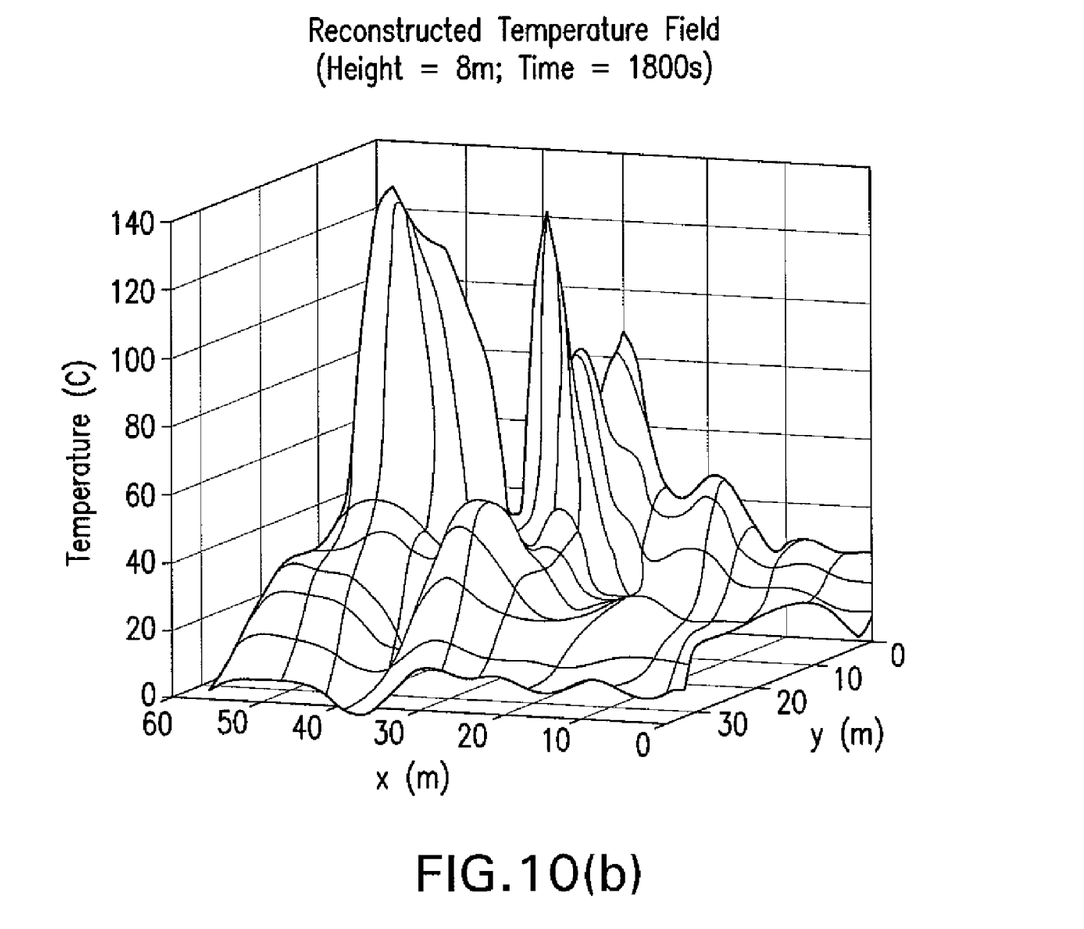
Figure 11A:
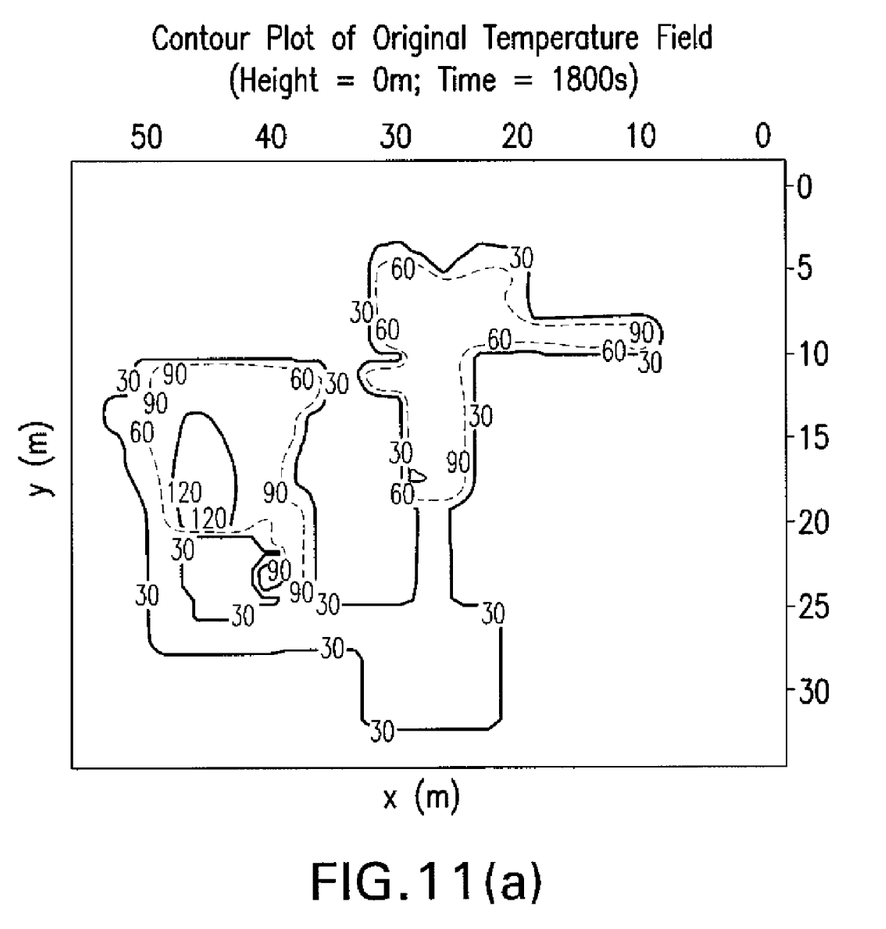
FIGS. 11(a)-(b) are a contour plot and a corresponding three dimensional graph, respectively, of the temperature distribution from a commercially available fire simulation application in accordance with an embodiment of the disclosed subject matter.
Figure 11B:
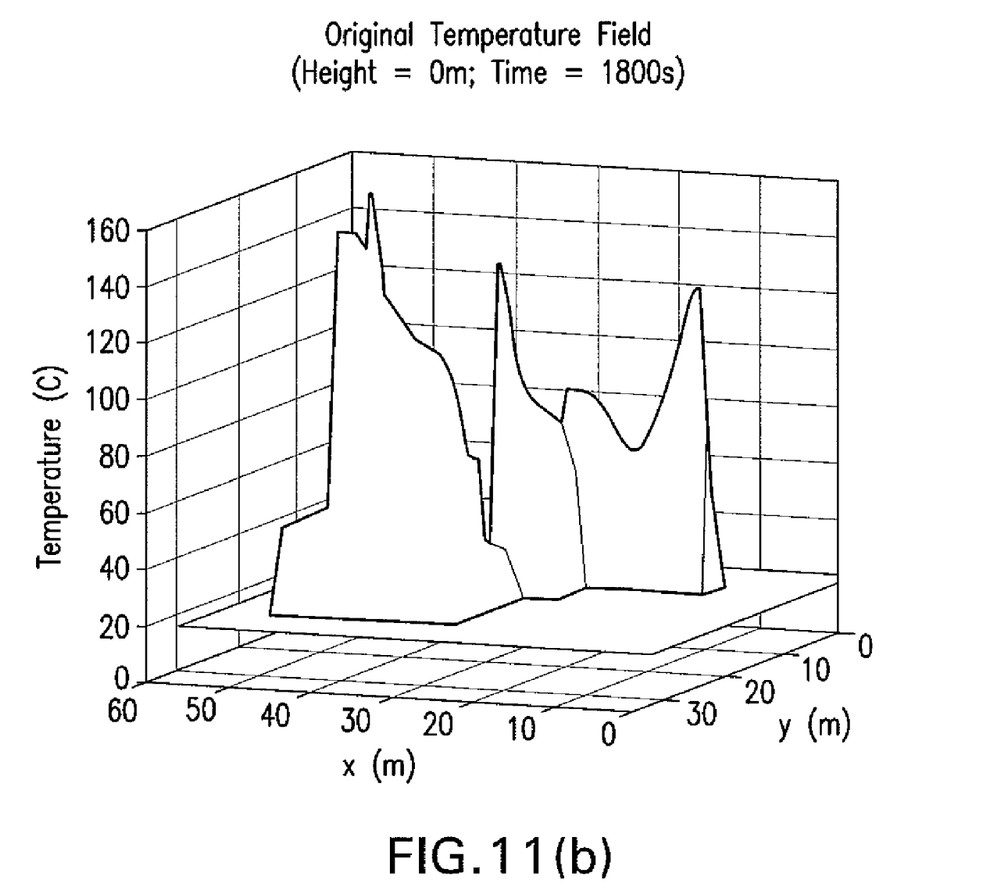

FIGS. 9(a) and 9(b) illustrate the model after a second iteration and FIGS. 10(a) and 10(b) show the model after a third iteration. The zoom-in strategy is a choice of the application, e.g., an area of interest could simply be defined as any region of temperature above a threshold. Sampling densities in different regions can be controlled by broadcasting instructions from the processing center via wireless access points. FIGS. 11(a) and 11(b) illustrate the actual physical field as produced using the National Institute of Standards and Technology (NIST) Fire Dynamics Simulator.

Figure 12:
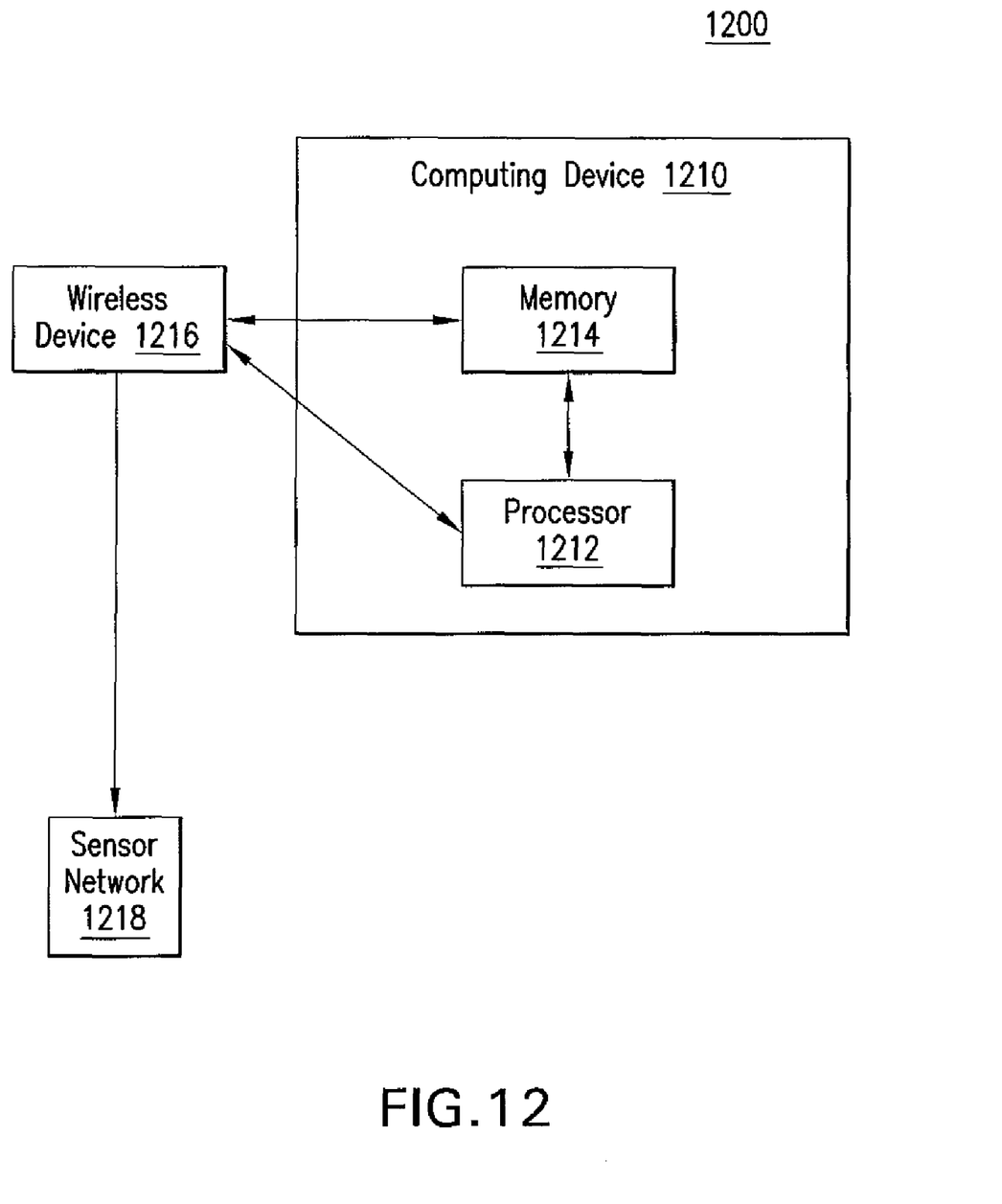
FIG. 12 is a schematic of a system in accordance with an embodiment of the disclosed subject matter.

FIG. 12 is an exemplary embodiment of a system 1200, with a computing device 1210. The device includes at least a processor 1212 operatively connected to a memory 1214. The computing device 1210 is operatively connected to a wireless connection device 1216, that can be running a wireless standard, e.g., a name-brand wireless access point running the 802.11 standard connected to the computing device 1210 by means of a wired connection. The device 1216 is operatively connected to a network of sensors 1218, e.g., by means of a wireless connection. The computing device 1210, can be a standard personal computer or a laptop. The network of sensors 1218 can be any sensors capable of running a wireless standard, e.g., the 802.11 standard. Software running on computing device 1210 can be used to coordinate the operation of the wireless connection device 1216 and sensors 1218, e.g., commercially available software for controlling devices running the 802.11 standard. The same or a different software running on computing device 1210 can be used to perform the reconstruction of the field. In an exemplary embodiment, the software can be a custom designed program.

It will be understood that the foregoing is only illustrative of the principles described herein, and that various modifications can be made by those skilled in the art without departing from the scope and spirit of the disclosed subject matter. For example, the system and methods described herein are used for telescopic data compression in sensor networks. It is understood that that techniques described herein are useful in connection with telescopic data compression of any network. Moreover, features of embodiments described herein may be combined and/or rearranged to create new embodiments.

We claim:

1. A method for telescopically compressing data received from a plurality of sensors in a network adapted to detect a field, comprising:
    (a) broadcasting a first set of one or more sampling positions to two or more of said plurality of sensors;
    (b) forming a first set of one or more clusters of sensors based on said one or more sampling positions;
    (c) receiving data from said two or more sensors contained within said one or more clusters;
    (d) performing local interpolation of said received data;
    (e) reconstructing a representation of said field using said interpolated data; and
    (f) determining one or more areas of interest based on said reconstructed representation of said field, to thereby enable said telescopic compression.

2. The method of claim 1, further comprising:
    (g) broadcasting a second set of one or more new sampling positions to two or more of said plurality of sensors within said one or more areas of interest;
    (h) forming a second set of one or more clusters based on said second set of one or more new sampling positions; and
    (i) repeating (c), (d), (e) and (f) one or more times utilizing said second set of one or more clusters, to thereby obtain said telescopic compression.

3. The method of claim 1, wherein said forming one or more clusters of sensors comprises designating one or more sensors as one or more cluster heads.

4. The method of claim 1, wherein said forming one or more clusters of sensors comprises selecting one or more sensors within a fixed range from said one or more sampling positions.

5. The method of claim 4, wherein said forming one or more clusters of sensors further comprises limiting the number of sensors selected by use of a probability algorithm.

6. The method of claim 1, wherein said forming one or more clusters of sensors comprises selecting a predetermined number of sensors that are closest to said one or more sampling positions.

7. The method of claim 3, wherein said receiving data from said two or more sensors comprises forwarding data of said two or more sensors contained within said one or more clusters to said one or more cluster heads.

8. The method of claim 3, wherein said performing local interpolation comprises:
    (a) using said one or more cluster heads to estimate the value of said field at said one or more sampling positions.

9. The method of claim 8, wherein said performing local interpolation further comprises:
    (b) using said one or more cluster heads to apply a digital low-pass filter algorithm to said data.

10. The method of claim 9, wherein estimating the value of said representation of said field and applying said digital low-pass filter algorithm are performed utilizing the same scattered data interpolation algorithm.

11. The method of claim 10, wherein said scattered data interpolation algorithm is a Gaussian-weighted averaging algorithm.

12. The method of claim 1, wherein said local interpolation is performed simultaneously for all of said one or more clusters.

13. The method of claim 1, wherein said reconstructing a representation of said field comprises:
    (a) transmitting said local interpolated data to one or more sensors closest to a wireless access point;

(b) transmitting said local interpolated data from said wireless access point to a processing center; and (c) processing said local interpolated data to reconstruct said representation of said field.

14. The method of claim 13, wherein said transmitting said local interpolated data to one or more sensors closest to a wireless access point is performed utilizing a shortest path algorithm.

15. A system for telescopically compressing data received from a plurality of sensors in a network adapted to detect a representation of a field, comprising:

a processor, a wireless connection device operatively coupled to the processor, two or more sensors operatively connected to said wireless connection device, and a memory operatively coupled to the processor, said memory storing program instructions that when executed by said processor, cause said processor to utilize the wireless connection device to:

broadcast a first set of one or more sampling positions to two or more of said plurality of sensors;

form a first set of one or more clusters of sensors based on said one or more sampling positions;

receive data from said two or more sensors contained within said one or more clusters;

perform local interpolation of said received data; reconstruct a representation of said field using said interpolated data; and determine one or more areas of interest based on said reconstructed representation of said field, to thereby enable said telescopic compression.

16. The system of claim 15, wherein said execution by said processor of said memory storing program instructions causes said processor to utilize said wireless connection device to further:

broadcast a second set of one or more new sampling positions to two or more of said plurality of sensors within said one or more areas of interest;

form a second set of one or more clusters based on said second set of one or more new sampling positions; and repeat said receipt of data from said two or more sensors contained within said one or more clusters, repeat said performance of local interpolation of said received data, repeat said reconstruction of a representation of said field using said interpolated data, and repeat said determination of one or more areas of interest based on said reconstructed representation of said field one or more times utilizing said second set of one or more clusters, to thereby obtain said telescopic compression.

17. The system of claim 15, wherein said execution by said processor of said memory storing program instructions further causes said processor to utilize said wireless connection device to designate one or more sensors as one or more cluster heads.

18. The system of claim 17, wherein said execution by said processor of said memory storing program instructions further causes said processor to utilize said wireless connection device to forward data of said two or more sensors contained within said one or more clusters to said one or more cluster heads.

19. The system of claim 17, wherein said execution by said processor of said memory storing program instructions further causes said processor to utilize said wireless connection device to use said one or more cluster heads to estimate the value of said field at said one or more sampling positions.

20. The system of claim 17, wherein said execution by said processor of said memory storing program instructions further causes said processor to utilize said wireless connection device to use said one or more cluster heads to apply a digital low-pass filter algorithm to said data.

21. The system of claim 20, wherein said execution by said processor of said memory storing program instructions further causes said processor to utilize said wireless connection device to perform said estimate of the value of said field, and said application of said digital low-pass filter algorithm utilizing the same scattered data interpolation algorithm.

22. The system of claim 15, wherein said execution by said processor of said memory storing program instructions further causes said processor to utilize said wireless connection device to:

transmit said local interpolated data to one or more sensors closest to a wireless access point;

transmit said local interpolated data from said wireless access point to a processing center; and process said local interpolated data to reconstruct said representation of said field.

* * * * *